United States Patent
Yin et al.

(10) Patent No.: US 9,530,861 B2
(45) Date of Patent: Dec. 27, 2016

(54) METHOD FOR MANUFACTURING SEMICONDUCTOR DEVICE

(75) Inventors: Haizhou Yin, Poughkeepsie, NY (US); Keke Zhang, Beijing (CN)

(73) Assignee: Institute of Microelectronics, Chinese Academy of Sciences, Beijing (CN)

( * ) Notice: Subject to any disclaimer, the term of this patent is extended or adjusted under 35 U.S.C. 154(b) by 0 days.

(21) Appl. No.: 14/399,260

(22) PCT Filed: Jul. 3, 2012

(86) PCT No.: PCT/CN2012/000912
§ 371 (c)(1),
(2), (4) Date: Nov. 6, 2014

(87) PCT Pub. No.: WO2013/166631
PCT Pub. Date: Nov. 14, 2013

(65) Prior Publication Data
US 2015/0118818 A1      Apr. 30, 2015

(30) Foreign Application Priority Data
May 8, 2012   (CN) .......................... 2012 1 0140207

(51) Int. Cl.
*H01L 29/66* (2006.01)
*H01L 29/78* (2006.01)
(Continued)

(52) U.S. Cl.
CPC ... *H01L 29/66545* (2013.01); *H01L 21/28008* (2013.01); *H01L 29/7833* (2013.01); *H01L 29/4966* (2013.01); *H01L 29/517* (2013.01)

(58) Field of Classification Search
CPC ............... H01L 29/66545; H01L 21/823864; H01L 21/823468
See application file for complete search history.

(56) References Cited

U.S. PATENT DOCUMENTS 6,667,199 B2 * 12/2003 Torii et al. .................... 438/183
7,666,746 B2 *  2/2010 Gambino .................... 438/287
(Continued)

FOREIGN PATENT DOCUMENTS

| CN | 101593686 | 12/2009 |
| CN | 102254824 | 11/2011 |

(Continued)

OTHER PUBLICATIONS

International search report for PCT/CN2012/000912, dated Jan. 31, 2013.

*Primary Examiner* — Yu-Hsi D Sun
(74) *Attorney, Agent, or Firm* — Treasure IP Group, LLC

(57) ABSTRACT

The present invention discloses a method for manufacturing a semiconductor device, comprising the steps of: forming a dummy gate stack structure on a substrate, wherein the dummy gate stack structure contains carbon-based materials; forming source/drain region in the substrate on both sides of the dummy gate stack structure; performing etching to remove the dummy gate stack structure until the substrate is exposed, resulting in a gate trench; and forming a gate stack structure in the gate trench. In accordance with the method for manufacturing a semiconductor device of the present invention, the dummy gate made of carbon-based materials is used to substitute the dummy gate made of silicon-based materials, then no oxide liner and/or etch blocking layer needs be added while the dummy gate is removed by etching in the gate last process, thus the reliability of device is ensured while the process is simplified and the cost is reduced.

9 Claims, 5 Drawing Sheets

(51) Int. Cl.
*H01L 21/28* (2006.01)
*H01L 29/49* (2006.01)
*H01L 29/51* (2006.01)

(56) References Cited

U.S. PATENT DOCUMENTS

| | | |
|---|---|---|
| 8,008,170 B2 * | 8/2011 | Liang et al. ............... 438/481 |
| 8,456,011 B2 * | 6/2013 | Lavoie et al. .............. 257/769 |
| 2012/0037991 A1 | 2/2012 | Guo |
| 2012/0181697 A1 * | 7/2012 | Lavoie ............. H01L 21/28518 257/769 |

FOREIGN PATENT DOCUMENTS

WO         2004012256 A1     2/2004
WO   WO 2004012256 A1 *   2/2004

\* cited by examiner

METHOD FOR MANUFACTURING SEMICONDUCTOR DEVICE

CROSS REFERENCE

This application is a National Phase application of, and claims priority to, PCT Application No. PCT/CN2012/000912, filed on Jul. 3, 2012, entitled 'METHOD FOR MANUFACTURING A SEMICONDUCTOR DEVICE', which claimed priority to Chinese Application No. CN 201210140207.X, filed on May 8, 2012. Both the PCT Application and Chinese Application are incorporated herein by reference in their entireties.

FIELD OF THE INVENTION

The present invention relates to a method for manufacturing a semiconductor device, in particular relates to a method for manufacturing a semiconductor device that is applied to a gate last process.

BACKGROUND OF THE INVENTION

The device size is required to be scaled down as the IC integration level constantly increases. In order to solve a series of problems caused by scaling down of the MOS device, the traditional $SiO_2$/polysilicon gate structure is generally substituted by the high-K/metal gate stack structure. Currently, the process for manufacturing a semiconductor device with a high-K/metal gate structure is mainly divided into a gate first process and a gate last process. The gate first process is first to manufacture the high-K/metal gate stack structure, and then to perform the source/drain implantation, whereas the gate last process is first to perform the source/drain implantation, and then to form the high-K/metal gate stack structure. Presently, the gate last process is gradually accepted in the industry since it is unnecessary for the gate last process to introduce high temperature for source/drain annealing.

In such a gate last process, generally, a dummy gate made of silicon-based materials such as polysilicon, microcrystalline silicon, and amorphous silicon is formed on the substrate. After performing etching to form a dummy gate stack structure, a source/drain doping implantation is performed with the dummy gate stack structure as a mask. Then, after depositing an interlayer dielectric layer, the dummy gate stack structure is removed by etching to result in a gate trench, in which a high-K material and a metal gate material are deposited. Since the dummy gate is made of a material similar to that of the substrate, both of which are made of silicon-based materials, the substrate will be inevitably overetched in the process of etching the dummy gate, resulting in an increase in the defect density in the surface of the channel region of the substrate, and thus the electrical performance and reliability of the device are degraded. Accordingly, an oxide liner (made of silicon oxide and high-K materials etc. with a general thickness of about 3 nm only) and/or an etch blocking layer (generally made of refractory-metal nitrides such as TiN and TaN with a thickness of about, e.g., 1 nm) must be formed on the substrate, and the channel region in the substrate can be protected by using the oxide liner and/or the etch blocking layer.

However, the oxide liner and/or the etch blocking layer has an ultra-thin thickness, so it is hard to be formed uniformly. As a result, the substrate may also be partially overetched during the process of etching to form a gate trench. Besides, formation of such an ultra-thin oxide liner and/or etch blocking layer involves complicated processes and expensive materials, hence it is hardly applicable to mass manufacture of the device, and it is difficult to improve efficiency and reduce cost effectively.

In summary, in the prior art it is difficult to protect the substrate from overetching in the gate last process with high efficiency and low cost.

SUMMARY OF THE INVENTION

As stated above, the present invention aims to provide a method for manufacturing a semiconductor device that can protect the substrate from overetching in the gate last process with high efficiency and low cost.

Therefore, the present invention provides a method for manufacturing a semiconductor device, comprising the steps of: forming a dummy gate stack structure on a substrate, wherein the dummy gate stack structure contains carbon-based materials; forming a source/drain region in the substrate on both sides of the dummy gate stack structure; performing etching to remove the dummy gate stack structure until the substrate is exposed, resulting in a gate trench; and forming a gate stack structure in the gate trench.

The dummy gate stack structure comprises a dummy gate layer and a dummy gate cap layer, and the dummy gate layer comprises the carbon-based materials.

The carbon-based materials comprise one of an amorphous carbon thin film and a hydrogenated amorphous carbon thin film, or a combination thereof.

After forming the source/drain region and before performing etching to remove the dummy gate stack structure, the method further comprises the steps of: depositing an interlayer dielectric layer, planarizing the interlayer dielectric layer until the dummy gate cap layer is exposed, and further planarizing the dummy gate cap layer until the dummy gate layer is exposed.

The step for forming the source/drain region further comprises: forming a first gate spacer in the substrate on both sides of the dummy gate stack structure; performing a first source/drain ion implantation with the first gate spacer as a mask, so as to form a lightly-doped source/drain extension region in the substrate on both sides of the dummy gate stack structure; forming a second gate spacer on sidewalls of the first gate spacer; and performing a second source/drain ion implantation with the second gate spacer as a mask, so as to form a heavily-doped source/drain region.

After forming the source/drain region and before performing etching to remove the dummy gate stack structure, the method further comprises the step of: forming a metal silicide on the source/drain region.

The dummy gate stack structure is removed by oxygen plasma etching. Wherein after removing the dummy gate stack structure by oxygen plasma etching, the residual oxide film is further removed by wet processing with HF-based etching solution.

The step for forming the gate stack structure further comprises: depositing a gate insulating layer in the gate trench; depositing a work function adjusting metal layer on the gate insulating layer; and depositing a resistance adjusting metal layer on the work function adjusting metal layer.

After forming the gate stack structure, the method further comprises the steps of: forming an interlayer dielectric layer and a contact etching stop layer; etching the interlayer dielectric layer and the contact etching stop layer to form source/drain contact holes; forming source/drain contact plugs in the source/drain contact holes by a filling step; and forming leads to connect with the source/drain contact plugs.

In accordance with the method for manufacturing a semiconductor device of the present invention, the dummy gate made of carbon-based materials is used to substitute the dummy gate made of silicon-based materials, then no oxide liner and/or etch blocking layer needs be added while the dummy gate is removed by etching in the gate last process, thus the reliability of device is ensured while the process is simplified and the cost is reduced.

BRIEF DESCRIPTION OF THE DRAWINGS

The technical solution of the present invention will be described in detail with reference to the drawings below, wherein.

DETAILED DESCRIPTION OF THE EMBODIMENTS

The features and the technical effects of the technical solution of the present application will be described in detail in combination with the illustrative embodiments with reference to the drawings, and disclosed herein is a method for manufacturing a semiconductor device that is capable of simplifying the removal of a dummy gate effectively. It should be pointed out that like reference signs indicate like structures, the terms such as "first", "second", "on", "below" used in the present invention may be used to modify various device structures or manufacturing processes. Except for specific explanations, these modifications do not imply the spatial, sequential or hierarchical relationships of the structures of the modified device or the manufacturing processes.

FIGS. 1 to 14 are diagrammatic cross-sections of the steps of the method for manufacturing a semiconductor device in accordance with the present invention.

Figure 1:
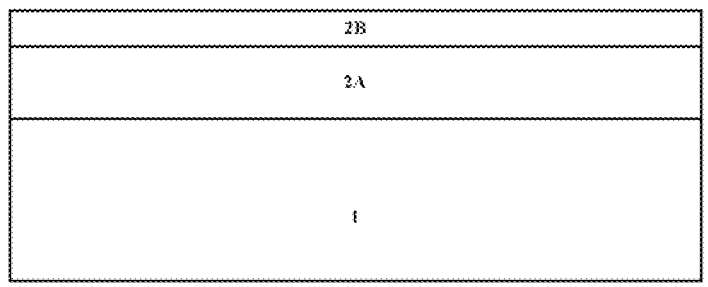
FIGS. 1 to 14 are diagrammatic cross-sections of the steps of the method for manufacturing a semiconductor device in accordance with the present invention.
Figure 2:
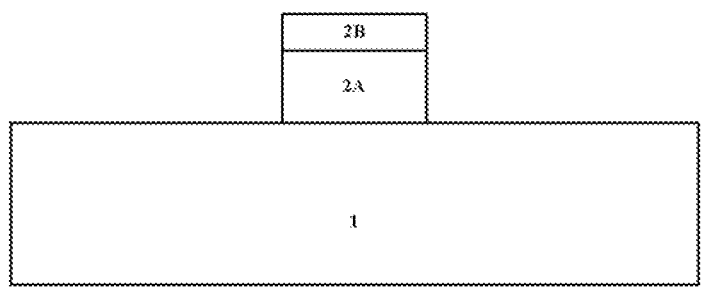
Figure 15:
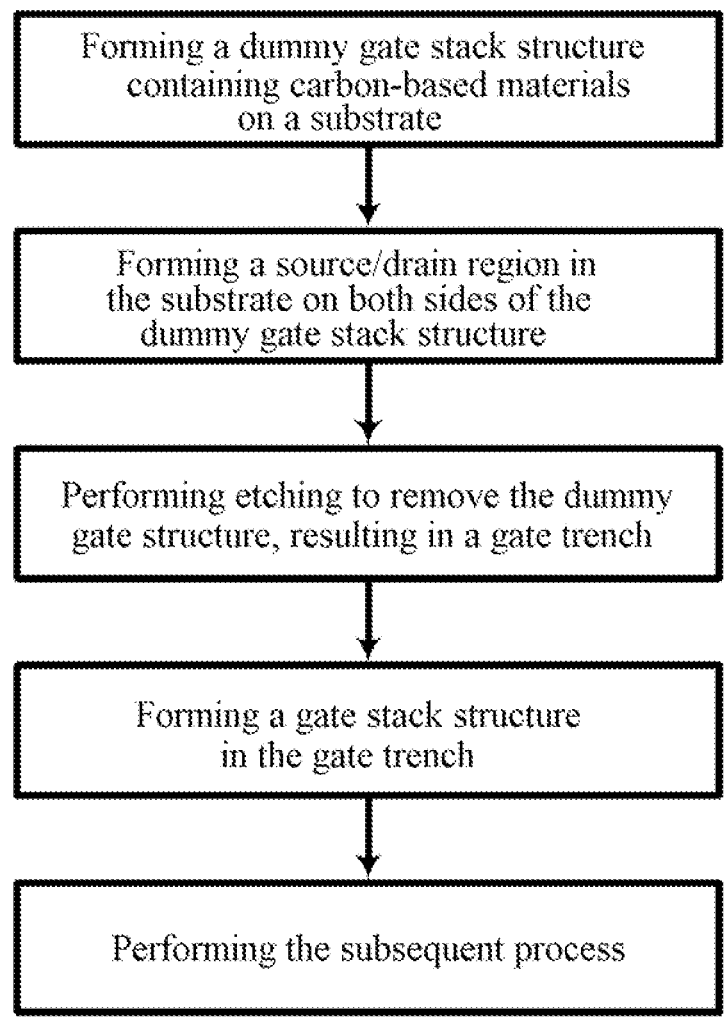
FIG. 15 is flow chart for the method for manufacturing a semiconductor device in accordance with the present invention.

Referring to FIG. 15 and FIGS. 1 and 2, a dummy gate stack structure 2 is formed on a substrate 1. There is provided a substrate 1, e.g., made of silicon-based materials, including bulk silicon (Si), silicon on insulator (SOI), SiGe, SiC, strained silicon, silicon nanotube etc. Preferably, bulk silicon or SOI is selected to make the substrate 1, so as to be compatible with the CMOS technology. As shown in FIG. 1, a dummy gate layer 2A and a dummy gate cap layer 2B are deposited on the substrate 1 sequentially by conventional processes such as LPCVD, PECVD, HDPCVD, ALD, MBE and sputtering. The dummy gate layer 2A is made of carbon-based materials, mainly including one of an amorphous carbon thin film (a-C) and a hydrogenated amorphous carbon thin film (a-C:H), or a combination thereof. The amorphous carbon thin film and hydrogenated amorphous carbon thin film are mainly obtained by processes such as cathode ray deposition, radio frequency sputtering, ion beam deposition, MV PECVD, RFPECVD, and HDPCVD. In the subsequent etching (e.g., dry etching with oxygen plasma) the dummy gate layer 2A made of carbon-based materials will react and will be removed, whereas the substrate 1 made of silicon-based materials will substantially not react and will not be etched, hence the two structures of different materials can automatically provide good etching selectivity, then no additional oxide liner and/or etch blocking layer needs be added. The dummy gate cap layer 2B is made of materials with higher hardness such as silicon nitride, silicon oxynitride, and diamond-like carbon (DLC) for protecting and controlling the shape of the dummy gate layer 2A. However, the dummy gate cap layer 2B may be omitted if the subsequent photolithography/etching can be controlled accurately, and thus the dummy gate stack structure 2 may substantially include the dummy gate layer 2A only. As shown in FIG. 2, the dummy gate layer 2A and the dummy gate cap layer 2B are photoetched/etched to form the dummy gate stack structure 2.

Figure 3:
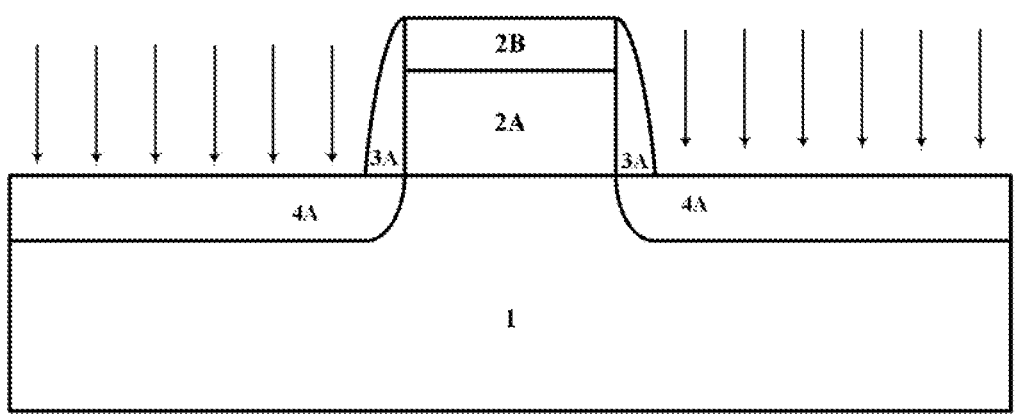
Figure 4:
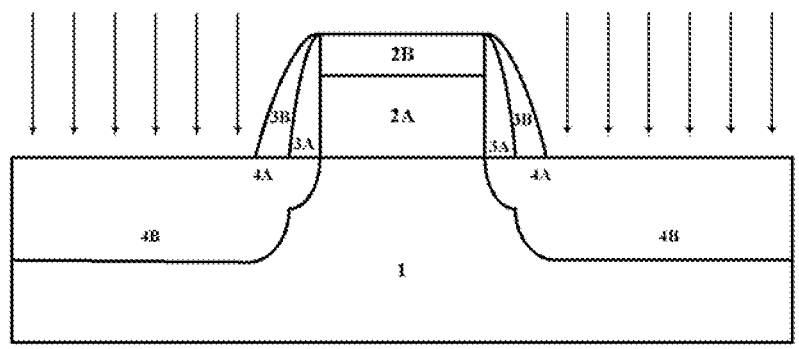

Referring to FIG. 15 and FIGS. 3 and 4, the dummy gate stack structure 2 is taken as a mask to perform a source/drain ion implantation, so as to form a source/drain region 4 in the substrate 1 on both sides of the dummy gate stack structure 2. As shown in FIG. 3, a first dummy gate spacer 3A is formed on the substrate 1 on both sides of the dummy gate stack structure 2 by the steps of first depositing and then performing etching, the material thereof may be, e.g., silicon dioxide, silicon nitride, silicon oxynitride, and DLC (since DLC has a higher intrinsic stress, it may additionally enhance the carrier mobility in the channel region, and increase the device driving capability); the dummy gate stack structure 2 and the first dummy gate spacer 3A are taken as a mask to perform a first source/drain ion implantation, so as to form a lightly-doped source/drain extension region 4A as well as a halo doped region (not shown) in the substrate 1 on both sides of the first dummy gate spacer 3A. The type, dose, and energy of the doped ions may be determined based on the type of the MOSFET and the junction depth, and no more unnecessary details will be provided here. It shall be noted that the first dummy gate spacer 3A may be omitted in practice, namely, the dummy gate stack structure 2 is directly taken as a mask to form a source/drain extension region 4A by implantation. As shown in FIG. 4, a second dummy gate spacer 3B is formed on sidewalls of the dummy gate stack structure 2 or the first dummy gate spacer 3A by the steps of first depositing and then performing etching, the material thereof may be, e.g., silicon dioxide, silicon nitride, silicon oxynitride, and DLC. The second dummy gate spacer 3B is taken as a mask to perform a second source/drain ion implantation, so as to form a heavily-doped source/drain region 4B in the substrate 1 on both sides of the second dummy gate spacer 3B. The doped ions for the second implantation is of the same type as those for the first implantation, but the dose and energy for the second implantation are larger to form the heavily-doped region.

Figure 5:
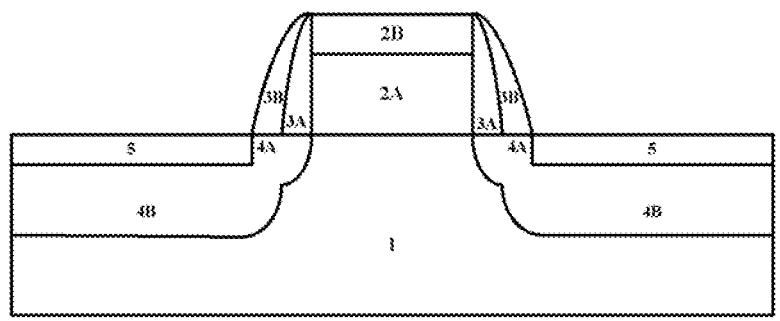

Preferably, referring to FIG. 15 and FIG. 5, a metal silicide 5 is formed on the source/drain region 4 by conventional processes such as sputtering and MOCVD. A metal layer (not shown) with a thickness of about, e.g., 1-10 nm, is deposited on the entire device, then annealing is performed at a temperature of about, e.g., 450-550□ such that the metal layer reacts with the Si in the source/drain region 4 to produce a metal silicide 5 for reducing the source/drain resistance of the device. The metal silicide 5 may be, e.g., NiSi, NiPtSi, NiCoSi, and NiPtCoSi with a thickness of about, e.g., 1-30 nm.

Figure 6:
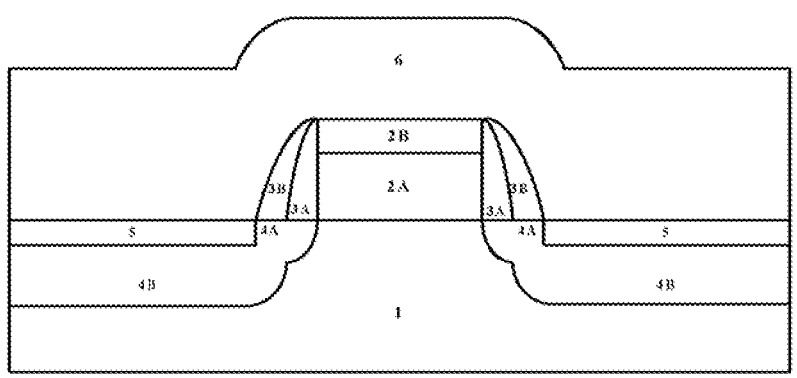

Referring to FIG. 15 and FIG. 6, an interlayer dielectric layer (ILD) 6 is deposited on the entire device by conventional processes such as LPCVD, PECVD, HDPCVD, and spin coating. The ILD 6 is made of, e.g., silicon oxide or low-K materials including, but not limited to, organic low-K materials (e.g., aryl- or polycyclic organic polymer), inorganic low-K materials (e.g., amorphous carbon nitride thin film, polycrystalline boron nitride thin film, fluorosilicate glass), porous low-K materials (Silsesquioxane (SSQ)-based porous low-K materials, porous silicon dioxide, porous SiOCH, C-doped silicon dioxide, F-doped porous amorphous carbon, porous diamond, porous organic polymer).

Figure 7:
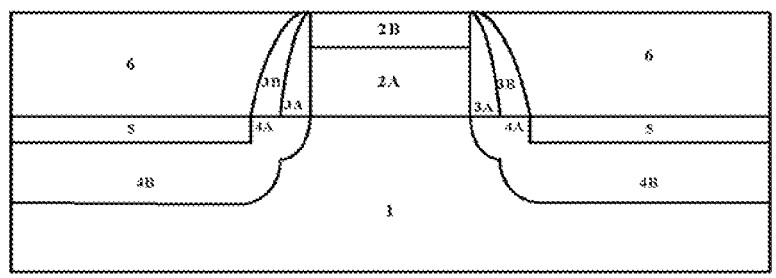
Figure 8:
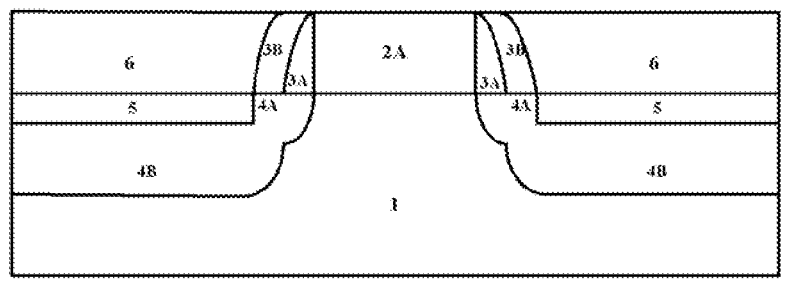

Referring to FIG. 15 and FIGS. 7 and 8, the ILD 6 and the dummy gate cap layer 2B are planarized until the dummy gate layer 2A is exposed. As shown in FIG. 7, a first CMP is performed, wherein the ILD 6 made of low-K materials is planarized until the dummy gate cap layer 2B made of nitride is exposed. Then, as shown in FIG. 8, the CMP grinding fluid, CMP pad and termination conditions are renewed to perform a second CMP, wherein the dummy gate cap layer 2B is planarized until the dummy gate layer 2A made of carbon-based materials is exposed.

Figure 9:
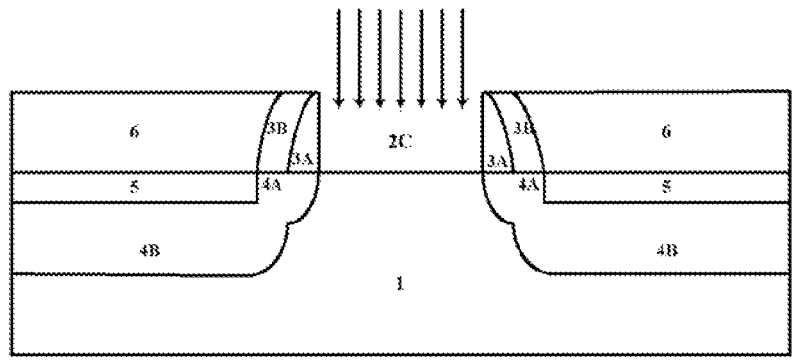
Figure 10:
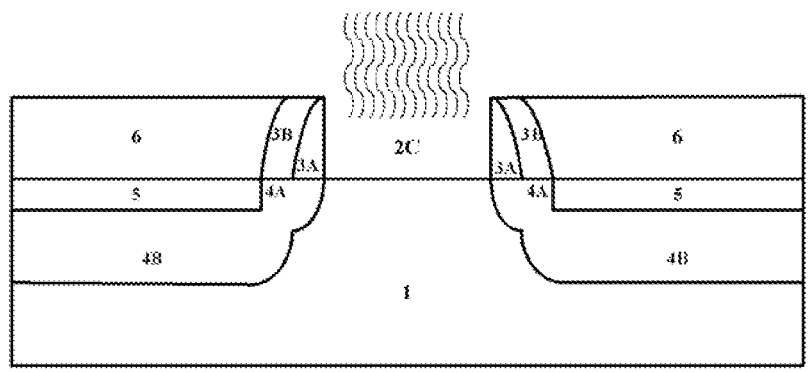

Referring to FIG. 15 and FIGS. 9 and 10, the dummy gate layer 2A is removed by etching to form a gate trench 2C. As shown in FIG. 9, dry etching such as oxygen plasma etching is used to remove the dummy gate layer 2A made of carbon-based materials until the substrate 1 is exposed. Because the dummy gate layer 2A is made of the above carbon-based materials, it will be removed by etching in process of etching with the oxygen plasma in which the amorphous carbon will react with the oxygen to produce carbon dioxide gas and the hydrogenated amorphous carbon will react with the oxygen to produce carbon dioxide and vapor. The substrate 1 made of silicon-based materials initially reacts to produce silicon oxide, which covers the surface of the substrate 1 to thereby block further reactive etching. Therefore, the substrate 1 substantially does not participate in the reaction or is substantially not etched. In short, in the process of etching to the dummy gate layer 2A, the substrate 1 is substantially not etched, and may form an oxide thin film (not shown, with a thickness of about 1-3 nm only) to protect the substrate 1. Thus, in the technical solution of the present invention, it is not needed to particularly deposit an oxide liner and/or an etch blocking layer before depositing the dummy gate layer 2A, and the device reliability is ensured while the process is simplified and the cost is reduced. Thereafter, preferably as shown in FIG. 10, HF-based etching solutions such as diluted HF (DHF) and buffered etch (mixed solution of BOE, HF and $NH_4F$) are used to remove the oxide thin film formed in the dry etching process.

Then, referring to FIG. 15 and FIGS. 11 to 14, the MOSFET structure is completed in subsequent processes which are the same or similar to the existing gate last process.

Figure 11:
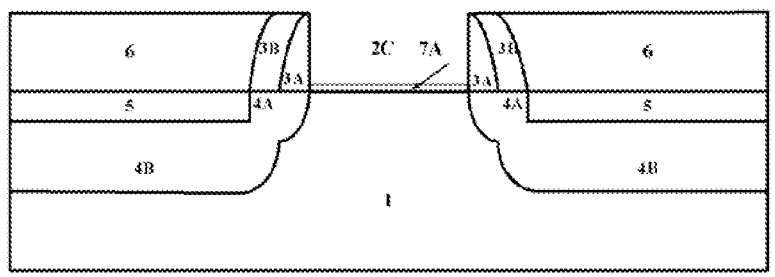

Referring to FIG. 11, a gate insulating layer 7A made of high-K materials is deposited in the gate trench 2C. The high-K materials include, but not limited to, nitride (e.g., SiN, MN, TiN), metal oxide (mainly including oxide of subgroup and lanthanide metal element such as $Al_2O_3$, $Ta_2O_5$, $TiO_2$, $ZnO$, $ZrO_2$, $HfO_2$, $CeO_2$, $Y_2O_3$, $La_2O_3$), perovskite phase oxide (e.g., $PbZr_xTi_{1-x}O_3$ (PZT), $Ba_xSr_{1-x}TiO_3$ (BST)). The gate insulating layer 7A may be formed on the bottom surface of the gate trench 2C and may have a thickness of about, e.g., 1 nm only, as shown in FIG. 11.

Figure 12:
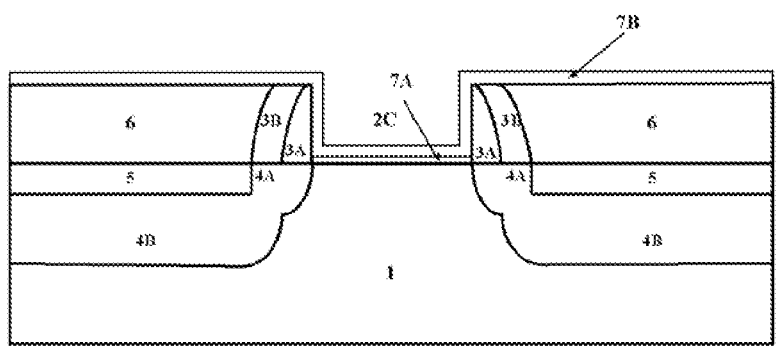

Referring to FIG. 12, a work function adjusting metal layer 7B made of materials such as TiN and TaN is deposited on the gate insulating layer 7A and the ILD 6 in the gate trench 2C.

Figure 13:
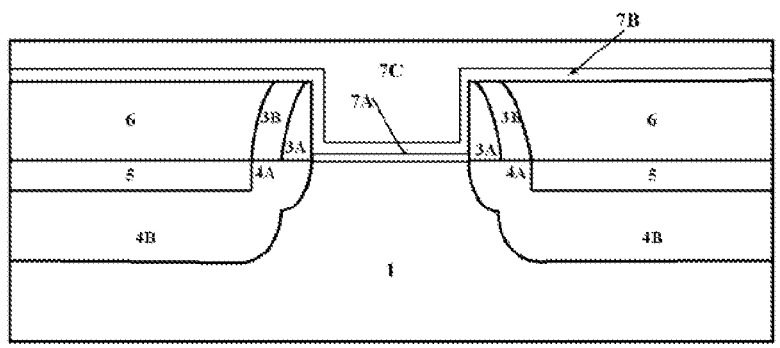

Referring to FIG. 13, a resistance adjusting metal layer 7C made of materials such as Ti, Ta, W, Al, Cu and Mo is deposited on the work function adjusting metal layer 7B. The layers 7A, 7B and 7C together constitute the final gate stack structure 7.

Figure 14:
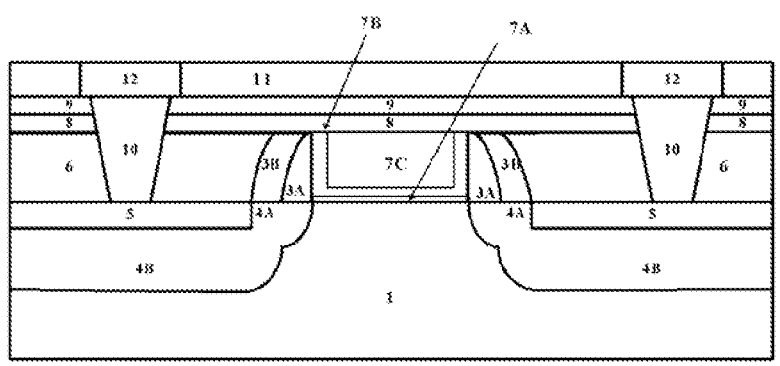

Referring to FIG. 14, the layer 7C is planarized until the ILD 6 is exposed, then a contact etching stop layer (CESL) 8 made of e.g., SiN and a second ILD 9 are deposited on the entire device, the second ILD 9, and then the CESL 8, and the ILD 6 are etched to form source/drain contact holes, then metal and/or metal nitride is filled in the source/drain contact holes to form source/drain contact plugs 10, afterwards a third ILD 11 is deposited and etched to form lead holes, later a metal is filled in the lead holes to form leads 12, so as to constitute the word lines or bit lines of the device, and the final device structure is completed.

In accordance with the method for manufacturing a semiconductor device of the present invention, the dummy gate made of carbon-based materials is used to substitute the dummy gate made of silicon-based materials, then no oxide liner and/or etch blocking layer needs be added while the dummy gate is removed by etching in the gate last process, thus the reliability of device is ensured while the process is simplified and the cost is reduced.

Although the present invention is described with reference to one or more illustrative embodiments, it may be appreciated by a person skilled in the art that various appropriate variations and equivalent modes may be made to the structure of the device without departing from the scope of the present invention. Furthermore, many modifications that may be applicable to specific situations or materials can be made according to the teachings disclosed above without departing from the scope of the present invention. Therefore, the object of the present invention is not to limit the invention to the specific embodiments disclosed as the preferred embodiments for implementing the present invention, the disclosed device structure and the manufacturing method will include all embodiments falling within the scope of the present invention.

What is claimed is:

1. A method for manufacturing a semiconductor device, comprising:
    forming a dummy gate stack structure on a substrate, wherein the dummy gate stack structure contains hydrogenated carbon-based materials, and wherein there is no oxide liner and/or etch blocking layer formed directly on the whole substrate;
    forming a source/drain region in the substrate on both sides of the dummy gate stack structure by forming at least one spacer having a high intrinsic stress on the substrate on both sides of the dummy gate stack structure;
    performing etching to remove the dummy gate stack structure until the substrate is exposed, resulting in a gate trench, and wherein the substrate is not substantially etched; and
    forming a gate stack structure in the gate trench.

2. The method for manufacturing a semiconductor device according to claim 1, wherein the dummy gate stack structure comprises a dummy gate layer and a dummy gate cap layer, and the dummy gate layer comprises the hydrogenated carbon-based materials.

3. The method for manufacturing a semiconductor device according to claim 2, wherein after forming the source/drain region and before performing etching to remove the dummy gate stack structure, the method further comprises the steps of: depositing an interlayer dielectric layer, planarizing the interlayer dielectric layer until the dummy gate cap layer is exposed, and further planarizing the dummy gate cap layer until the dummy gate layer is exposed.

4. The method for manufacturing a semiconductor device according to claim 1, wherein the step for forming the source/drain region further comprises:
   forming a first gate spacer on the substrate on both sides of the dummy gate stack structure;
   performing a first source/drain ion implantation with the first gate spacer as a mask, so as to form a lightly-doped source/drain extension region in the substrate on both sides of the dummy gate stack structure;
   forming a second gate spacer on sidewalls of the first gate spacer; and
   performing a second source/drain ion implantation with the second gate spacer as a mask, so as to form a heavily-doped source/drain region.

5. The method for manufacturing a semiconductor device according to claim 1, after forming the source/drain region and before performing etching to remove the dummy gate stack structure, the method further comprises the step of: forming a metal silicide on the source/drain region.

6. The method for manufacturing a semiconductor device according to claim 1, wherein the dummy gate stack structure is removed by oxygen plasma etching, and residual oxide film is formed on the substrate during the oxygen plasma etching.

7. The method for manufacturing a semiconductor device according to claim 6, wherein after removing the dummy gate stack structure by oxygen plasma etching, the residual oxide film is further removed by wet processing with HF-based etching solution.

8. The method for manufacturing a semiconductor device according to claim 1, the step for forming the gate stack structure further comprises: depositing a gate insulating layer in the gate trench; depositing a work function adjusting metal layer on the gate insulating layer; and depositing a resistance adjusting metal layer on the work function adjusting metal layer.

9. The method for manufacturing a semiconductor device according to claim 1, wherein after forming the gate stack structure, the method further comprises the steps of: forming an interlayer dielectric layer and a contact etching stop layer; etching the interlayer dielectric layer and the contact etching stop layer to form source/drain contact holes; filling to form source/drain contact plugs in the source/drain contact holes; and
   forming leads to connect with the source/drain contact plugs.

* * * * *